United States Patent
Voutilainen et al.

(10) Patent No.: US 10,630,927 B2
(45) Date of Patent: Apr. 21, 2020

(54) QUANTUM DOT SENSOR READOUT

(71) Applicant: Nokia Technologies Oy, Espoo (FI)

(72) Inventors: Martti Voutilainen, Espoo (FI); Sami Kallioinen, Espoo (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/559,706

(22) PCT Filed: Mar. 2, 2016

(86) PCT No.: PCT/FI2016/050125
§ 371 (c)(1),
(2) Date: Sep. 19, 2017

(87) PCT Pub. No.: WO2016/151185
PCT Pub. Date: Sep. 29, 2016

(65) Prior Publication Data
US 2018/0054585 A1 Feb. 22, 2018

(30) Foreign Application Priority Data

Mar. 23, 2015 (EP) ..................... 15160237

(51) Int. Cl.
*H04N 5/374* (2011.01)
*H04N 5/3745* (2011.01)
(Continued)

(52) U.S. Cl.
CPC ... *H04N 5/37455* (2013.01); *H01L 27/14643* (2013.01); *H01L 31/035218* (2013.01);
(Continued)

(58) Field of Classification Search
CPC ........ H04N 5/374; H04N 5/378; H04N 5/369; H04N 5/2256; H01L 27/14601; H01L 27/1446; H01L 27/14665
See application file for complete search history.

(56) References Cited

U.S. PATENT DOCUMENTS

| | | | |
|---|---|---|---|
| 8,324,555 B2 | 12/2012 | Ludwig | 250/214 A |
| 2015/0070546 A1* | 3/2015 | Negoro | H01L 27/14681 348/300 |

(Continued)

FOREIGN PATENT DOCUMENTS

| | | |
|---|---|---|
| CN | 101777583 A | 7/2010 |
| CN | 102576715 A | 7/2012 |

(Continued)

OTHER PUBLICATIONS

Klekachev, Alexander V., et al., "Graphene Transistors and Photodetectors", The Electro Chemical Society Interface, Spring 2013, pp. 63-68.

(Continued)

*Primary Examiner* — Twyler L Haskins
*Assistant Examiner* — Angel L Garces-Rivera
(74) *Attorney, Agent, or Firm* — Harrington & Smith

(57) ABSTRACT

An apparatus, including a quantum dot graphene field effect transistor configured to operate such that photons incident thereon cause electron-hole pairs to be formed; a connector element connected to the back gate of the transistor; a switch element as an output switch to provide an output for a current flowing through the transistor. The transistor is configured to be back gate biased via the connector element connected to the back gate such that the electrons or the holes formed are trapped in an at least one quantum dot and respectively the holes or the electrons migrate to the channel of the transistor. A drain to source voltage connected to the transistor causes a current proportional to the charge of the holes or electrons trapped at the quantum dots by the electrons or holes to flow in the channel.

12 Claims, 4 Drawing Sheets

(51) Int. Cl.
H01L 27/146 (2006.01)
H01L 31/0352 (2006.01)
H01L 27/142 (2014.01)
H01L 31/112 (2006.01)
H04N 5/378 (2011.01)

(52) U.S. Cl.
CPC .......... H04N 5/374 (2013.01); *H01L 27/142* (2013.01); *H01L 31/112* (2013.01); *H04N 5/378* (2013.01)

(56) References Cited

U.S. PATENT DOCUMENTS

2015/0078530 A1 3/2015 Hawver et al. ............... 378/98
2015/0364545 A1* 12/2015 Heo .................... H01L 29/1033
257/24

FOREIGN PATENT DOCUMENTS

| CN | 103000220 A | 3/2013 |
| CN | 103814445 A | 5/2014 |
| EP | 2 846 536 A1 | 3/2015 |
| EP | 3073728 A1 | 9/2016 |

OTHER PUBLICATIONS

Gerasimos Konstantatos et al. "Hybrid Graphene-quantum dot Phototransistors with Ultrahigh Gain", Nature Nanotechnology, vol. 7, No. 6, Jan. 1, 2012 (Jan. 1, 2012), pp. 363-368, XP055039980.

* cited by examiner

QUANTUM DOT SENSOR READOUT

TECHNICAL FIELD

The present application generally relates to imaging sensors. In particular, but not exclusively, the application relates to readout of imaging sensors. In particular, but not exclusively, the application relates to readout of quantum dot field effect transistor based sensors.

BACKGROUND

This section illustrates useful background information without admission of any technique described herein representative of the state of the art.

Graphene field effect transistors (GFET) functioning as phototransistors, are used in imaging sensor applications. They have a very high charge carrier mobility, but previously it has been impossible to provide a feasible sensor, and especially large area sensor array, architecture since it is has been difficult to enable temporary signal storage due to the continuously flowing current of the GFET.

Previously GFETs have been used in imaging sensor by changing the current into voltage using integrating transimpedance amplifiers and storing integrated charge in a sample and hold capacitor after the amplifier. Such an arrangement requires the amplifier arrangement for each pixel, i.e. each GFET, separately increasing cost and power requirements, especially in large area sensor arrays, such as used for example in x-ray imaging.

SUMMARY

Various aspects of examples of the invention are set out in the claims.

According to a first example aspect of the present invention, there is provided an apparatus, comprising:
a quantum dot graphene field effect transistor configured to operate in such a way that photons incident thereon cause electron-hole pairs to be formed;
a connector element connected to the back gate of the quantum dot graphene field effect transistor;
a switch element configured to function as an output switch in order to provide an output for a current flowing through the quantum dot graphene field effect transistor; wherein
the quantum dot graphene field effect transistor is configured to be back gate biased via the connector element connected to the back gate in such a way that the electrons or the holes formed are trapped in an at least one quantum dot and respectively the holes or the electrons migrate to the channel of the quantum dot field effect transistor; and wherein
a drain to source voltage connected to the quantum dot graphene field effect transistor causes a current proportional to the charge of the holes or electrons trapped at the quantum dots by the electrons or holes to flow in the channel.

The switch element may comprise a field effect transistor.

The charge accumulated at the quantum dot graphene field effect transistor may be configured to be reset by a reset pulse via the connector element to the back gate.

According to a second example aspect of the present invention, there is provided a system, comprising
at least one apparatus according to the first example aspect; and
an amplifier circuitry connected to the output of the at least one apparatus and comprising a current to voltage or a current to charge converter and a capacitive element for sampling a voltage proportional to the current flowing through the at least one quantum dot graphene field effect transistor.

The at least one apparatus may comprise more than one apparatus and the amplifier circuitry may be connected to the output of more than one apparatus.

The drain electrodes of more than one apparatus may be shared.

The at least one apparatus may comprise an array of apparatuses and each row of apparatuses in the array may have a shared drain electrode; and the apparatus may further comprise a column select electrode for each column in the array.

The system may further comprise a multiplexer element enabling sampling the outputs one by one.

The system may further comprise an analog-to-digital converter element.

According to a third example aspect of the present invention, there is provided a method comprising
back gate biasing with a back gate voltage at least one quantum dot graphene field effect transistor in such a way that that electrons or holes formed by photons incident on the transistor are trapped in an at least one quantum dot and respectively the holes or electrons formed by photons incident on the quantum dot graphene field effect transistor migrate to the channel of the quantum dot graphene field effect transistor;
enabling the at least one quantum dot graphene field effect transistor to be illuminated with photons;
connecting a drain source voltage to the quantum dot graphene field effect transistor causing a current proportional to the charge of the holes or electrons trapped at the quantum dots of the quantum dot graphene field effect transistor to flow in the channel;
connecting the current to an amplifier circuitry with a switch element;
converting the current to voltage; and
sampling the voltage with a capacitive element.

The method may further comprise resetting the charge of the quantum dot graphene field effect transistor with a back gate pulse.

The method may further comprise choosing the current to be connected to the amplifier circuitry with a switch element.

According to a fourth example aspect of the present invention, there is provided a computer program comprising computer code for causing performing the method of the third example aspect, when executed by an apparatus.

According to a fifth example aspect of the present invention, there is provided a non-transitory memory medium comprising the computer program of the fourth example aspect.

Any memory medium hereinbefore or hereinafter may comprise a digital data storage such as a data disc or diskette, optical storage, magnetic storage, holographic storage, opto-magnetic storage, phase-change memory, resistive random access memory, magnetic random access memory, solid-electrolyte memory, ferroelectric random access memory, organic memory or polymer memory. The memory medium may be formed into a device without other substantial functions than storing memory or it may be formed as part of a device with other functions, including but not limited to a memory of a computer, a chip set, and a sub assembly of an electronic device. In the context of this document, a "memory medium" may be any non-transitory media or means that can contain, store, communicate, propagate or transport the instructions for use by or in connection with an instruction execution system, apparatus, or device, such as a computer.

Different non-binding example aspects and embodiments of the present invention have been illustrated in the foregoing. The embodiments in the foregoing are used merely to explain selected aspects or steps that may be utilized in implementations of the present invention. Some embodiments may be presented only with reference to certain example aspects of the invention. It should be appreciated that corresponding embodiments may apply to other example aspects as well.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE DRAWINGS

An example embodiment of the present invention and its potential advantages are understood by referring to FIGS. 1 through 4 of the drawings. In this document, like reference signs denote like parts or steps.

Figure 1:
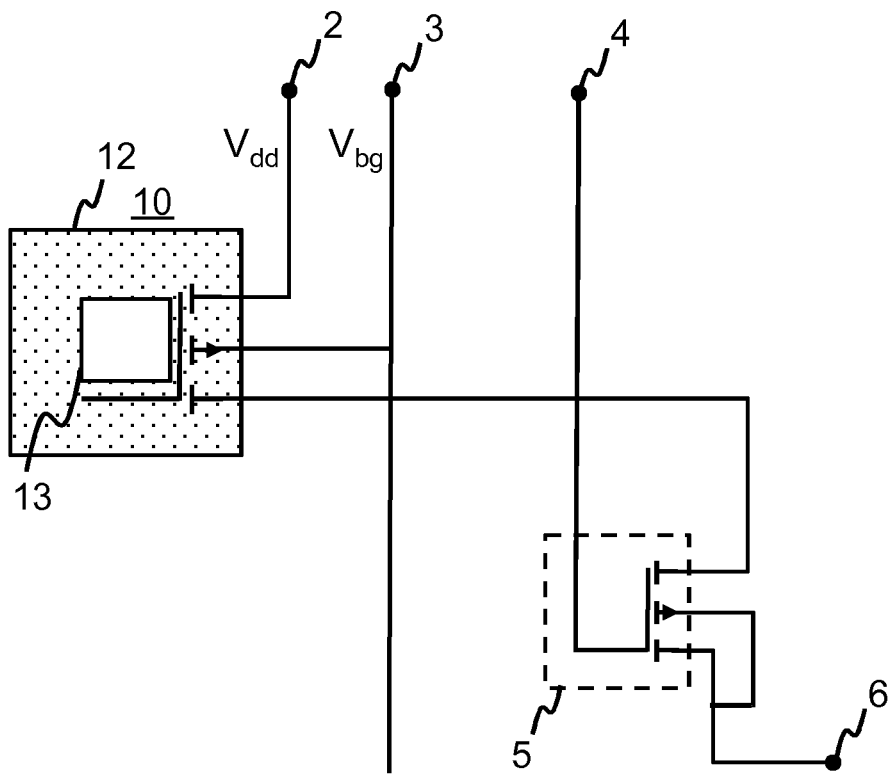
FIG. 1 shows a schematic view of an apparatus according to an example embodiment of the invention.

FIG. 1 shows a schematic view of an apparatus 100 according to an example embodiment. The apparatus comprises a quantum dot graphene field effect transistor (QD-GFET) comprising a graphene layer 12 and at least one quantum dot 13 thereon. In an example embodiment the graphene layer 12 comprises a mono- or bilayer of graphene. In an example embodiment, the at least one quantum dot 13 comprises a thin film of colloidal quantum dots. The apparatus 100 further comprises a connector element 2 connected to the drain of the QD-GFET 10 with a voltage Vdd and a connector element 3 connected to the back gate of the QD-GFET 10 and configured to provide back gate voltage Vbg for back gate biasing of the QD-GFET 10. It is to be noted that the QD-GFET 10 comprises gate, source and drain electrodes. The apparatus further comprises a switch element configured to function as an output switch and to provide an output for a current flowing through the QD-GFET. In an example embodiment, the apparatus comprises a field effect transistor (FET) 5 configured to function as the output switch. The drain of the FET 5 is connected to the source of the QD-GFET 10 and the source and back gate of the FET 5 are connected to a connector element 6 configured to function as an output of the apparatus. The gate of the FET 5 is connected to a connector element 4 configured to provide the signal for reading the output 6. The QD-GFET 10 is configured to operate as a phototransistor, i.e. photons incident on the QD-GFET 10 are absorbed into the at least one quantum dot 13 and generate electron-hole pairs. A photon is a quantum of electromagnetic radiation. In an example embodiment the QD-GFET 10 is configured to operate as a sensor for x-ray photons.

Figure 2:
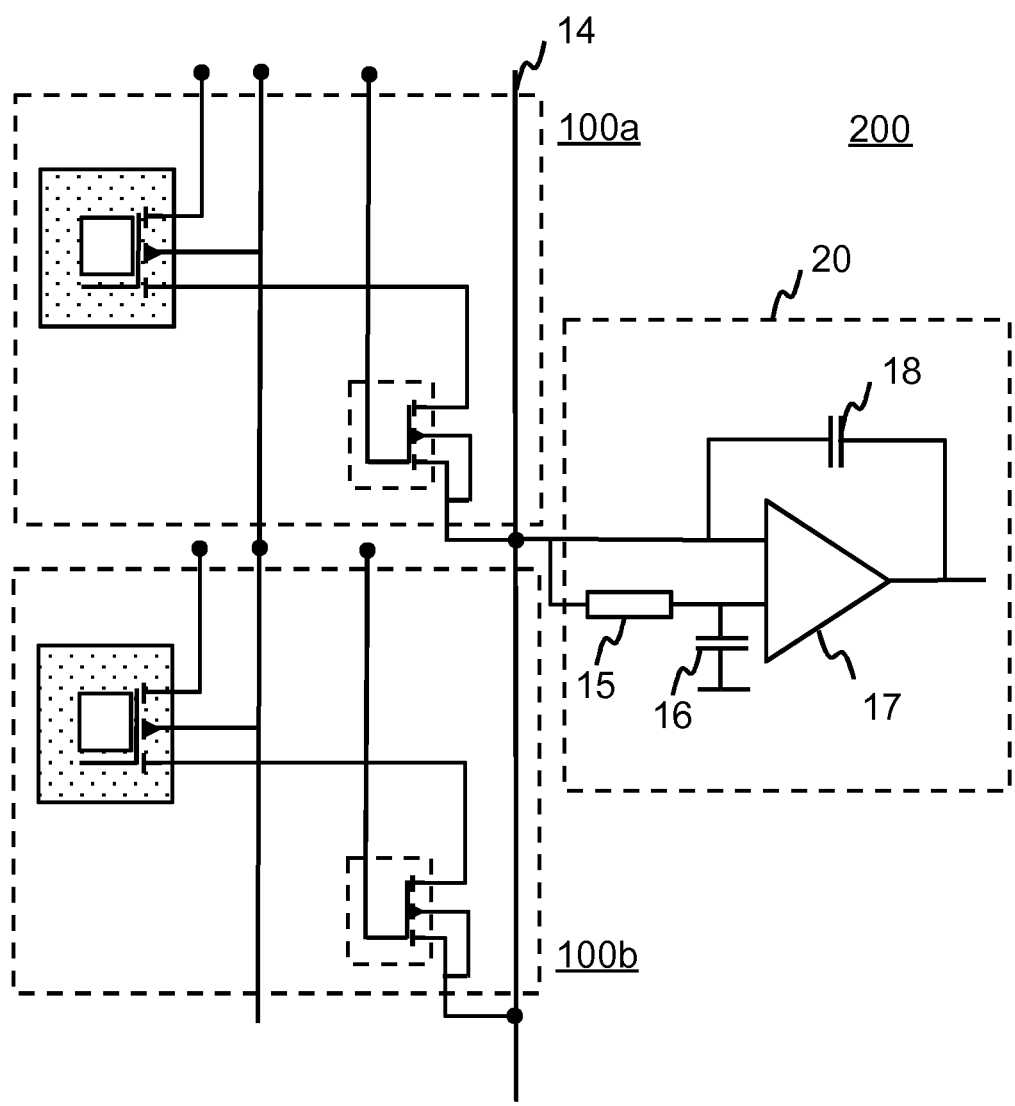
FIG. 2 shows a schematic view of an system according to a further example embodiment of the invention.

FIG. 2 shows a schematic view of a system 200 according to a further example embodiment of the invention. The system 200 comprises in an example embodiment, at least one apparatus 100a,100b. Although FIG. 2 shows two apparatuses 100a,100b, the system in a further embodiment comprises a single apparatus, or several apparatuses forming a sensor array. Each apparatus 100a,100b corresponds to a single pixel of an imaging sensor. The system 200 further comprises an output connector element 14 to which the output 6 (FIG. 1) of each apparatus is connected to. The system 200 further comprises a charge-to-voltage or current-to-voltage transimpedance amplifier circuitry 20, comprising an operational amplifier 17, a resistive element 15 and a capacitive element 16. The elements 15,16 are chosen in such a way as to provide a large time constant in order to set a virtual ground to idle QD-GFET 10 operation point. Alternatively, in a further example embodiment, virtual ground voltage is set by controllable voltage source or resistor ladder between supply voltages. The circuitry 20 further comprises a capacitive element 18. In a further example embodiment a resistive element is connected in parallel with the capacitive element and the circuit 20 is configured to operate as a current-to-voltage transimpedance amplifier. The system 200, in an example embodiment, operates as described hereinafter with reference to FIGS. 1 and 2.

The QD-GFET is back gate biased by the back gate voltage Vbg to such a condition that as incident photons generate electron-hole pairs in the at least one quantum dot 13, the electrons stay, or are trapped, in the quantum dots and the holes pass the potential barrier, lowered by the back gate voltage Vbg, to the channel of the QD-GFET 10. The transfer time of the holes to the channel of the QD-GFET is in an example embodiment in the range of milliseconds, or hundreds of milliseconds.

Subsequently a drain source voltage is connected to a single pixel, i.e. to a single QD-GFET 10, or to a group of QD-GFETs, and current proportional to the charge trapped in quantum dots of the QD-GFET 10, i.e. proportional to the photons incident on the QD-GFET 10 starts to flow. The current flowing is connected by the FET 5 to the amplifier circuitry 20 that converts the current into voltage that is then stored to the capacitive element or fed to the next gain or filter stage 18. In a further example embodiment, instead of the electrons, the holes are trapped into the at least one quantum dot 13 and the electrons are transferred into QD-GFET 10 channel.

Figure 3:
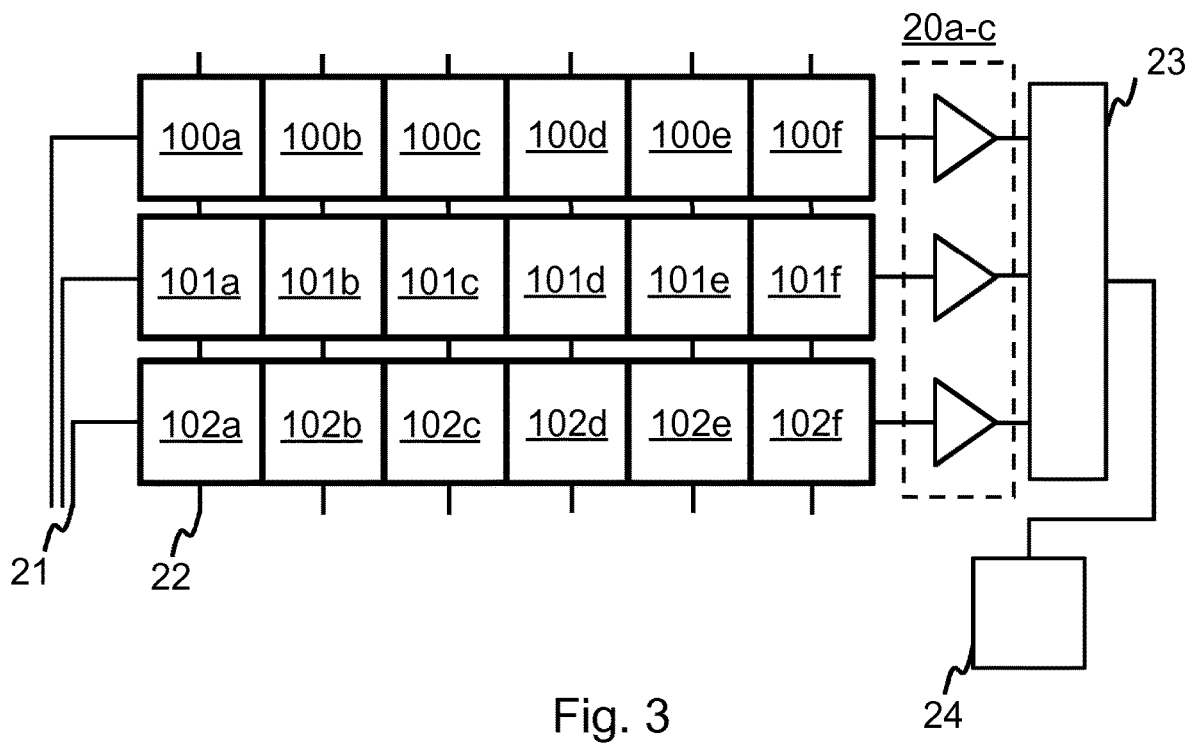
FIG. 3 shows a further schematic view of a system according to a further example embodiment of the invention.

FIG. 3 shows a further schematic view of a system according to a further example embodiment of the invention. The system comprises pixels 100a-f, 101a-f, 102a-f forming an imaging sensor array. Each pixel either comprises the whole apparatus 100 (as shown in FIG. 1) or merely the QD-GFET 10. In an example embodiment, the switching FET 5 is shared with for example a row of pixels. FIG. 3 shows the drain electrodes, i.e. connector elements, 21 of the rows of pixels, the drain electrodes being formed by the border area of the pixels and connected to each other within the row. In an example embodiment, the drain electrodes of a row are not connected to the drain electrodes of the other rows for power saving reasons. The system further comprises column selection connector elements, or electrodes, 22 and amplifier circuitry 20a-c. In an example embodiment, the number of amplifier circuitry 20a-c corresponds to the number of rows. In a further example embodiment, the number of amplifier circuitry is larger or smaller. The system further comprises a multiplexer element 23 for selecting the output which is to be sampled, i.e. enabling the pixels to be read one by one, and an analog-to-digital converter element 24. In an example embodiment, a single multiplexer 23 and an analog-to-digital converter 24 is connected to one or more pixel rows depending on the requirements of the system. In a still further embodiment, the rows and columns are interchanged, i.e. each column has a common drain electrode and is connected to amplifier circuitry 20a-c.

Figure 4:
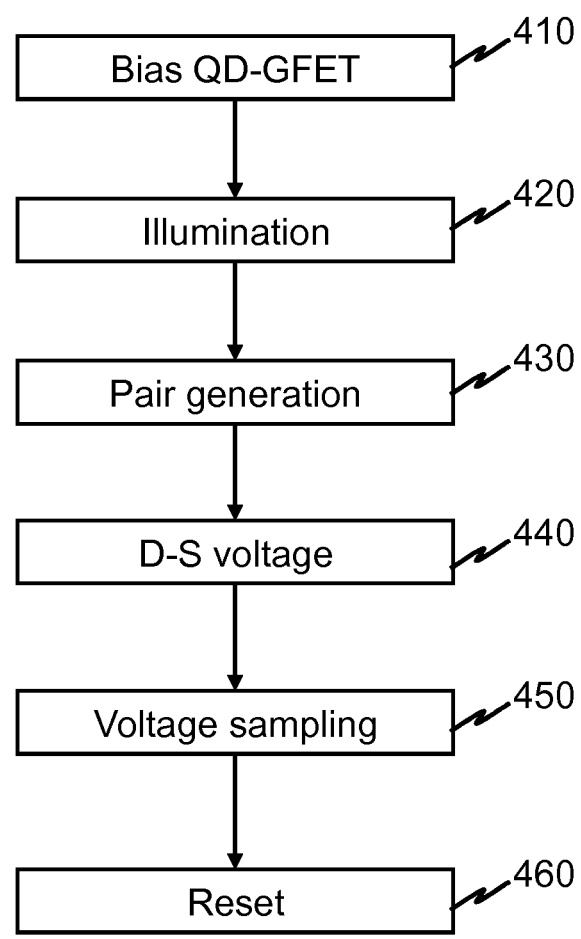
FIG. 4 shows a flow chart of a method according to an example embodiment of the invention.

FIG. 4 shows a flow chart of an example process of operating an apparatus according to an example embodiment. At 410 the pixel, or pixels, i.e. the required amount of QD-GFETs, is back gate biased to a required predetermined setting. At 420 the pixels are illuminated, i.e. photons are incident on the pixel. At 430, the photons absorbed into the quantum dots generate electron-hole pairs. The holes migrate towards the channel of the QD-GFET, and the electrons remain trapped in the quantum dot. At 440 a drain source voltage is connected and current begins to flow through the QD-GFETs. At 450 the amplifier circuitry connected to a desired number of pixels, for example one, converts the current that is proportional to the charge, i.e. holes, that have migrated through the channel, into voltage that is then sampled into a capacitive element. In the embodiment having a resistor connected in parallel with the capacitor in element 18, the amplifier circuitry converts instantaneous current into instantaneous voltage. It is to be noted, that the electrons remain trapped in the quantum dots for a certain time, depending on the structure of the QD-GFEt, and accordingly the QD-GFETs function as temporary signal storage and signal current proportional to the charge of the trapped electrons need not be read from all QD-GFETs simultaneously or instantly. At 460, should the charge hold time of the QD-GFET be longer than required by the application, the charge stored, i.e. accumulated, into the QD-GFET quantum dots is cleared, i.e. reset, with a voltage pulse, reset pulse, to the back gate prior to starting the method again from 410. In a further example embodiment, instead of the electrons, the holes are trapped into the quantum dots and the electrons are transferred into QD-GFET channel. It is to be noted that the operations as hereinbefore described are in an example embodiment controlled by a processor of an apparatus in which an imaging sensor comprising an apparatus or system according to example embodiments of the invention is comprised, the processor being configured to execute program code for causing the operations described hereinbefore.

Without in any way limiting the scope, interpretation, or application of the claims appearing below, a technical effect of one or more of the example embodiments disclosed herein is the provision of a QD-GFET imaging sensor in which temporary signal storage is enabled. Another technical effect of one or more of the example embodiments disclosed herein is an increased detection sensitivity, as a single photon generates in the range of $10^5$-$10^8$ charge carriers to transfer through the QD-GFET channel. Another technical effect of one or more of the example embodiments disclosed herein is the provision of a simple sampling circuitry as amplifier circuitry is not required for each pixel. A still further technical effect of one or more of the example embodiments disclosed herein is a QD-GFET sensor with significantly decreased power consumption because source-drain voltage need to be connected only for the period when signal is handled by the amplifier.

Embodiments of the present invention may be implemented in software, hardware, application logic or a combination of software, hardware and application logic. In an example embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device. A computer-readable medium may comprise a computer-readable storage medium that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the before-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the foregoing describes example embodiments of the invention, these descriptions should not be viewed in a limiting sense. Rather, there are several variations and modifications which may be made without departing from the scope of the present invention as defined in the appended claims.

The invention claimed is:

1. An apparatus, comprising:
at least one pixel apparatus comprising:
a quantum dot graphene field effect transistor configured to operate in such a way that photons incident thereon cause electron-hole pairs to be formed;
a connector element connected to the back gate of the quantum dot graphene field effect transistor;
a switch element configured to function as an output switch in order to provide an output for a current flowing through the quantum dot graphene field effect transistor,
wherein the quantum dot graphene field effect transistor is configured to be back gate biased via the connector element connected to the back gate in such a way that the electrons or the holes formed are trapped in an at least one quantum dot and respectively the holes or the electrons migrate to the channel of the quantum dot field effect transistor, and
such that a charge accumulated in the quantum dot field effect transistor can be reset by a reset pulse via the connector element to the back gate, and
wherein a drain to source voltage connected to the quantum dot graphene field effect transistor causes a current proportional to a charge of the holes or electrons trapped at the quantum dots by the electrons or holes to flow in the channel,
amplifier circuitry connected to the output of the at least one pixel apparatus and comprising a current to voltage or a current to charge converter and a first capacitive element for sampling a voltage proportional to the current flowing through the at least one quantum dot graphene field effect transistor, the converter comprising an operational amplifier, a resistive element and a second capacitive element, wherein the operational amplifier has a first input coupled to the output of the at least one pixel apparatus, an input of the resistive element is coupled to the output of the at least one pixel apparatus, an output of the resistive element is coupled to an input of the second capacitive element and to the second input of the operational amplifier, and an output of the second capacitive element is coupled to ground.

2. The apparatus of claim 1, wherein the switch element comprises a field effect transistor.

3. The apparatus of claim 1, comprising a plurality of the pixel apparatuses, and the amplifier circuitry is connected to the output of more than one pixel apparatus.

4. The apparatus of claim 1, wherein the drain electrodes of more than one pixel apparatus are shared.

5. The apparatus of claim 1, wherein the apparatus comprises an array of pixel apparatuses and each row of pixel apparatuses in the array has a shared drain electrode; and the apparatus further comprises a column select electrode for each column in the array.

6. The apparatus of claim 1, further comprising a multiplexer element enabling sampling the outputs one by one.

7. The apparatus of claim 1, further comprising an analog-to-digital converter element.

8. The apparatus of claim 1, wherein values of the resistive element and capacitive element are chosen to provide a time constant in order to set a virtual ground to idle operation point.

9. A method comprising:
back gate biasing with a back gate voltage at least one quantum dot graphene field effect transistor of a pixel apparatus in such a way that that electrons or holes formed by photons incident on the transistor are trapped in an at least one quantum dot and respectively the holes or electrons formed by photons incident on the quantum dot graphene field effect transistor migrate to the channel of the quantum dot graphene field effect transistor;
enabling the at least one quantum dot graphene field effect transistor to be illuminated with photons;
connecting a drain source voltage to the quantum dot graphene field effect transistor via a connector element to the back gate causing a current proportional to a charge of the holes or electrons trapped at the quantum dots of the quantum dot graphene field effect transistor to flow in the channel;
resetting a charge accumulated in the quantum dot field effect transistor by a reset pulse via the connector element to the back gate;
connecting the current to amplifier circuitry with a switch element;
converting the current to voltage using the amplifier circuitry, wherein the amplifier circuitry is connected to the output of the pixel apparatus and comprises a current to voltage converter and a first capacitive element for sampling a voltage proportional to the current flowing through the at least one quantum dot graphene field effect transistor, the converter comprising an operational amplifier, a resistive element and a second capacitive element, wherein the operational amplifier has a first input coupled to the output of the pixel apparatus, an input of the resistive element is coupled to the output of the pixel apparatus, an output of the resistive element is coupled to an input of the second capacitive element and to the second input of the operational amplifier, and an output of the second capacitive element is coupled to ground; and
sampling the voltage with the first capacitive element.

10. The method of claim 9, further comprising resetting the charge of the quantum dot graphene field effect transistor with a back gate pulse.

11. The method of claim 9, further comprising choosing the current to be connected to the amplifier circuitry from a plurality of the pixel apparatuses with a corresponding one of a plurality of switch elements.

12. A computer program product embodied on a non-transitory memory medium in which a computer program is stored that, when being executed by a computer, is configured to provide instructions to control or carry out the method of claim 9.

* * * * *